(12) United States Patent
Togami et al.

(10) Patent No.: US 11,287,586 B2
(45) Date of Patent: *Mar. 29, 2022

(54) APPARATUS AND METHOD FOR THERMAL DISSIPATION OF PHOTONIC TRANSCEIVING MODULE

(71) Applicant: Marvell Asia Pte Ltd., Singapore (SG)

(72) Inventors: Chris Togami, San Jose, CA (US); Radhakrishnan L. Nagarajan, San Jose, CA (US); Gary Sasser, San Jose, CA (US); Brian Taylor, San Jose, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,269

(22) Filed: Nov. 11, 2020

(65) Prior Publication Data
US 2021/0088739 A1    Mar. 25, 2021

Related U.S. Application Data

(63) Continuation of application No. 16/578,090, filed on Sep. 20, 2019, now Pat. No. 10,942,323.

(51) Int. Cl.
*G02B 6/42* (2006.01)
*F28F 1/14* (2006.01)
*H05K 7/20* (2006.01)

(52) U.S. Cl.
CPC .............. *G02B 6/4269* (2013.01); *F28F 1/14* (2013.01); *H05K 7/2049* (2013.01); *F28F 2215/08* (2013.01); *F28F 2275/14* (2013.01)

(58) Field of Classification Search
CPC ....... G02B 6/4269; H05K 7/2049; F28F 1/14; F28F 2275/14; F28F 2215/08
See application file for complete search history.

(56) References Cited

U.S. PATENT DOCUMENTS

| | | | |
|---|---|---|---|
| 9,453,972 B1* | 9/2016 | Arvelo | H05K 7/20409 |
| 10,104,760 B1* | 10/2018 | Briant | G02B 6/4284 |
| 10,942,323 B1* | 3/2021 | Togami | G02B 6/4269 |
| 2005/0162834 A1* | 7/2005 | Nishimura | H05K 5/0286 |
| | | | 361/710 |
| 2013/0210269 A1* | 8/2013 | Neer | H05K 7/20145 |
| | | | 439/487 |

(Continued)

*Primary Examiner* — Stephen S Sul
(74) *Attorney, Agent, or Firm* — Harness, Dickey & Pierce, P.L.C.

(57) ABSTRACT

An apparatus for dissipating heat from a photonic transceiver module. The apparatus includes a top-plate member disposed in a length direction of a package for the photonic transceiver module. The apparatus further includes multiple fins formed on the top-plate member along the length direction from a backend position to a frontend position except at least one fin with a shorter length, forming an elongated void from the backend position to one backend of the at least one fin. Additionally, the apparatus includes a cover member disposed over the multiple fins with a horizontal sheet, two vertical side sheets, and a flange bent vertically from a middle portion of backend of the horizontal sheet. Furthermore, the apparatus includes a spring loaded in the elongated void between the flange and the one backend of the at least one fin to minimize an air gap at the backend of the horizontal sheet.

20 Claims, 8 Drawing Sheets

(56) References Cited

U.S. PATENT DOCUMENTS

| | | | |
|---|---|---|---|
| 2016/0021787 A1* | 1/2016 | Lei | H05K 1/0203 |
| | | | 361/720 |
| 2016/0149324 A1* | 5/2016 | Regnier | H01R 43/205 |
| | | | 439/76.1 |
| 2016/0211623 A1* | 7/2016 | Sharf | G02B 6/4269 |
| 2017/0168253 A1* | 6/2017 | Wilcox | G02B 6/4277 |
| 2018/0049348 A1* | 2/2018 | Bucher | H01R 13/6581 |
| 2018/0199468 A1* | 7/2018 | Hall, III | G02B 6/4246 |
| 2018/0338387 A1* | 11/2018 | Park | G02B 6/4269 |
| 2019/0044299 A1* | 2/2019 | Kazav | H01R 13/518 |
| 2019/0271818 A1* | 9/2019 | Cabessa | G02B 6/428 |
| 2019/0379417 A1* | 12/2019 | English | G02B 6/4269 |

* cited by examiner

APPARATUS AND METHOD FOR THERMAL DISSIPATION OF PHOTONIC TRANSCEIVING MODULE

CROSS-REFERENCE TO RELATED APPLICATIONS

The present application is a continuation of and claims priority to U.S. patent application Ser. No. 16/578,090, filed Sep. 20, 2019, all commonly assigned and hereby incorporated by references for all purposes.

BACKGROUND OF THE INVENTION

The present disclosure is related to a photonics technology, more particularly, to an apparatus and a method for efficient thermal dissipation of a photonic transceiver module.

As science and technology are progressing rapidly, processing speed and capacity of the computer increase correspondingly. The communication transmission or reception using the traditional cable is limited to bandwidth and transmission speed of the traditional cable, but the mass information transmission required in modern life causes the traditional communication transmission overload. To address such requirements, the optical fiber transmission system replaces the traditional communication transmission system gradually. The optical fiber transmission system does not have bandwidth limitation, and also has advantages of high-speed data transmission, long transmission distance, its material is impervious to electromagnetic waves. Therefore, the electronics industry performs research toward optical fiber transmission which will become the mainstream in the future. Said optical communication is a technology in that light waves function as signal carriers and transmitted between two nodes via the optical fiber. Field of optical communication can be divided into optical communication side and electric communication side according to transmission medium. By the optical transceiver, the received optical signal can be converted to an electrical signal capable of being processed by an IC, or the processed electrical signal can be converted to the optical signal to be transmitted via optical fiber. Therefore, objective of communication can be achieved.

The high-speed data transmission needs high-performance photonic transceiver which needs high efficiency heat dissipation during its operation. For example, a latest QSFP-DD transceiver module expects to multi-fold of heat dissipation function over a module package size only 20% bigger. Therefore, it is desired to have an improved apparatus for efficiently dissipating heat from a package of a photonic transceiver module.

BRIEF SUMMARY OF THE INVENTION

The present disclosure is related to a photonics technology, more particularly, to an apparatus and a method for efficiently dissipating heat away from a package of a photonic transceiver module. In certain embodiments, the invention is applied for high bandwidth optical communication, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Stacking chips into so-called 3-D ICs promises a one-time boost in their capabilities, but it's very expensive. Another way to achieve this goal in this disclosure is to use multiple chip module technology.

In an example, an alternative method to increase the bandwidth is to move the optical devices close to electrical device. Silicon photonics is an important technology for moving optics closer to silicon. In this patent application, we will disclose a high-speed electrical optics multiple chip module device to achieve terabits per second speed, as well as variations thereof Silicon photonics has led to development of compact packages of photonic transceiver modules in many pluggable specifications. Yet, the compact package of powerful photonic transceiver module needs innovated design for efficiently dissipating heat away during its operation.

In a specific embodiment, the present disclosure provides an apparatus for dissipating heat from a photonic transceiver module. The apparatus includes a top-plate member disposed in a length direction of a package for the photonic transceiver module. Additionally, the apparatus includes multiple fins with one length formed on the top-plate member along the length direction from a backend position near middle of the top-plate member to a frontend position except that an elongated void is formed from the backend position of the multiple fins to one backend of at least one fin with a shorter length. Furthermore, the apparatus includes a cover member disposed over the multiple fins with a horizontal sheet, two vertical side sheets, and a flange bent vertically from a middle portion of a backend of the horizontal sheet. Moreover, the apparatus includes a spring loaded in the elongated void between the flange and the one backend of the at least one fin for naturally pushing the cover member to slide backward beyond the backend position of the multiple fins until the backend of the horizontal sheet is stopped against an object.

In another aspect; the present disclosure provides a method of dissipating heat from a package of a photonic transceiver module. The method includes a step of setting a top-plate member disposed in a length direction of the package. Additionally, the method includes forming multiple fins of one length on the top-plate member along the length direction from a backend position near middle of the top-plate member to a frontend position except an elongated void being formed from the backend position of the multiple fins to one backend of at least one fin with a shorter length. Furthermore, the method includes disposing a cover member over the multiple fins with a horizontal sheet, two vertical side sheets, and a flange bent vertically from a middle portion of a backend of the horizontal sheet. Moreover, the method includes loading a spring in the elongated void between the flange and the one backend of the at least one fin for naturally pushing the cover member backward beyond the backend position of the multiple fins until the backend of the horizontal sheet is stopped against an object.

In yet another aspect, the present disclosure provides a package structure for a photonic transceiver module comprising an apparatus of claim 1 for dissipating heat up to 20 W therefrom.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present disclosure is related to a photonics technology, more particularly, to an apparatus and a method for efficiently dissipating heat away from a package of a photonic transceiver module. In certain embodiments, the invention is applied for high bandwidth optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, horizontal, vertical, side, inner face, outer face, forward, reverse, clockwise and counter-clockwise have been used for convenience purposes only and are not intended to imply any particular fixed direction. Instead, they are used to reflect relative locations and/or directions between various portions of an object.

Figure 1:
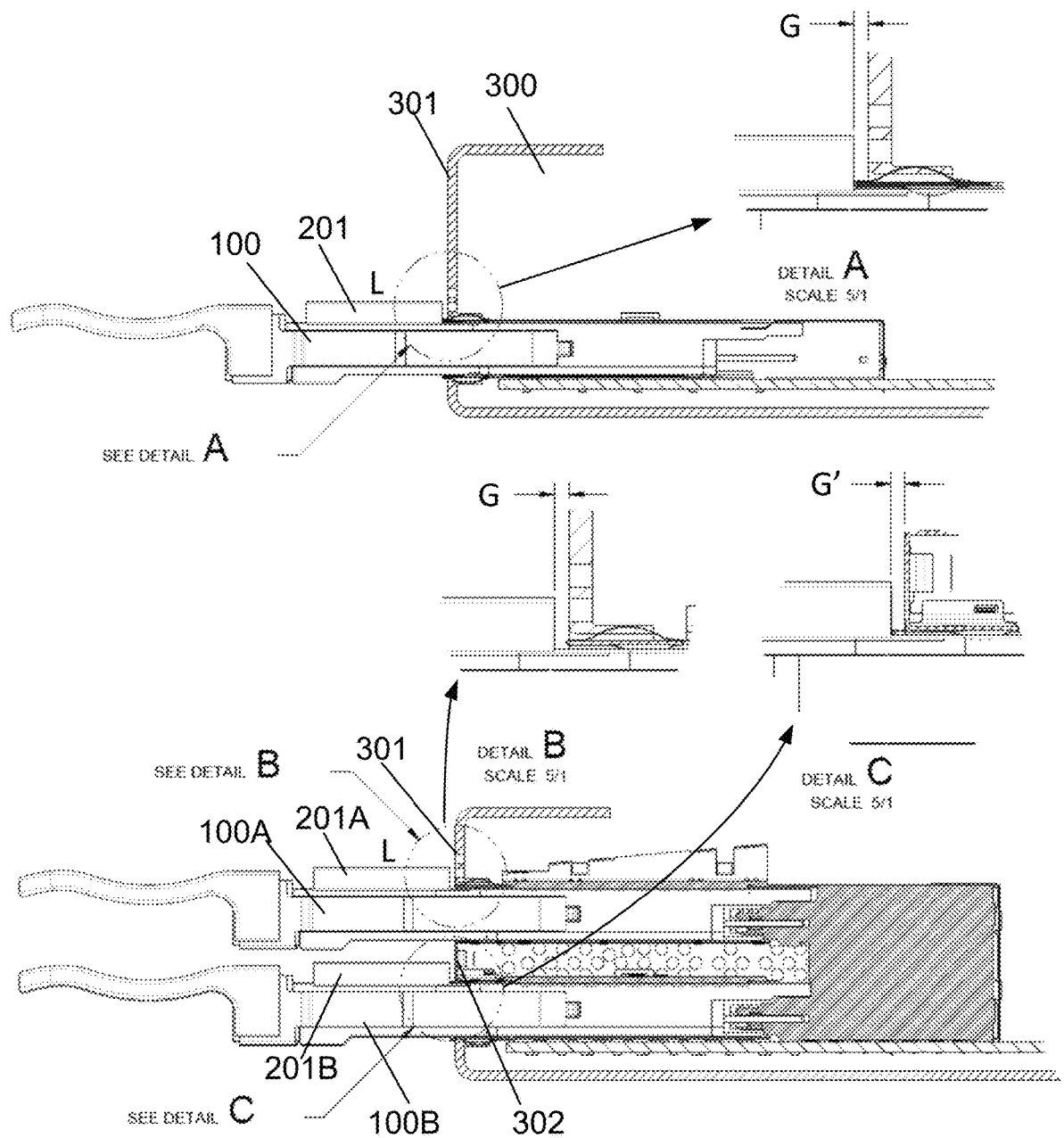
FIG. 1 is a side view of a photonic transceiver module with external heat sink plugged into a custom system equipment according to an embodiment of the present invention.

FIG. 1 is a side view of a photonic transceiver module with external heat sink plugged into a custom system equipment according to an embodiment of the present invention. The photonic transceiver module has been developed very fast in resent years to provide high data rates of 4×10 Gbit/s, 4×28 Gbit/s or higher for high-speed data communications applications. The photonic transceiver module is also characterized by its small form factor pluggable package structure. For example, As shown, the package structure is compatible with the Quad Small Form-factor Pluggable (QSFP) specification, or Quad Small Form-factor Pluggable Double-Density (QSFP-DD) specification, or latest Quad Small Form-factor Pluggable Double-Density Type II (QSFP-DD Type 2) specification. With high data rate being provided, higher laser power and higher frequency may be involved, yielding more heat during its operation. Thermal dissipation of the heat generated by the photonics transceiver modules has become a key focus for new module mechanical design. Past designs only had to dissipate 2-4 W of power, but the state-of-art modules are expected to dissipate up to 20 W in a package that is only 25% larger in size than past design.

Referring to FIG. 1, using the QSFP-DD module as an example, the package 100 (of the photonics transceiver module) usually is coupled with an internally air-cooled thermal sink 300 associated with customer network system frame for heat dissipation. Because of the higher thermal load of newer modules in the QSFP-DD specification, an external thermal sink 200 fixed to a top-plate member of the package 100 has been proposed for added cooling efficiency. The external thermal sink 200 is integrated on the top-plate member along a length direction from a first position at a frontend of the package 100 to a second position near middle region of the top-plate member. The external thermal sink 200 has a fixed cover over multiple fins, all having a length of L, to form multiple air-flow channels in gaps between neighboring fins under the cover. As the photonics transceiver module is plugged to the network system frame, the second position of the external heat sink 200 must be set just outside a bezel face plate 301 of the internally air-cooled thermal sink 300. The bezel face plate 301 has been configured to have multiple through-holes. As air is pulled by a fan from the internally air-cooled thermal sink 300 inside a customer system frame, air is assumed to be pulled through the air-flow channels in the integrated external thermal sink 200 to help dissipate heat on the front of the photonics transceiver module.

Figure 2:
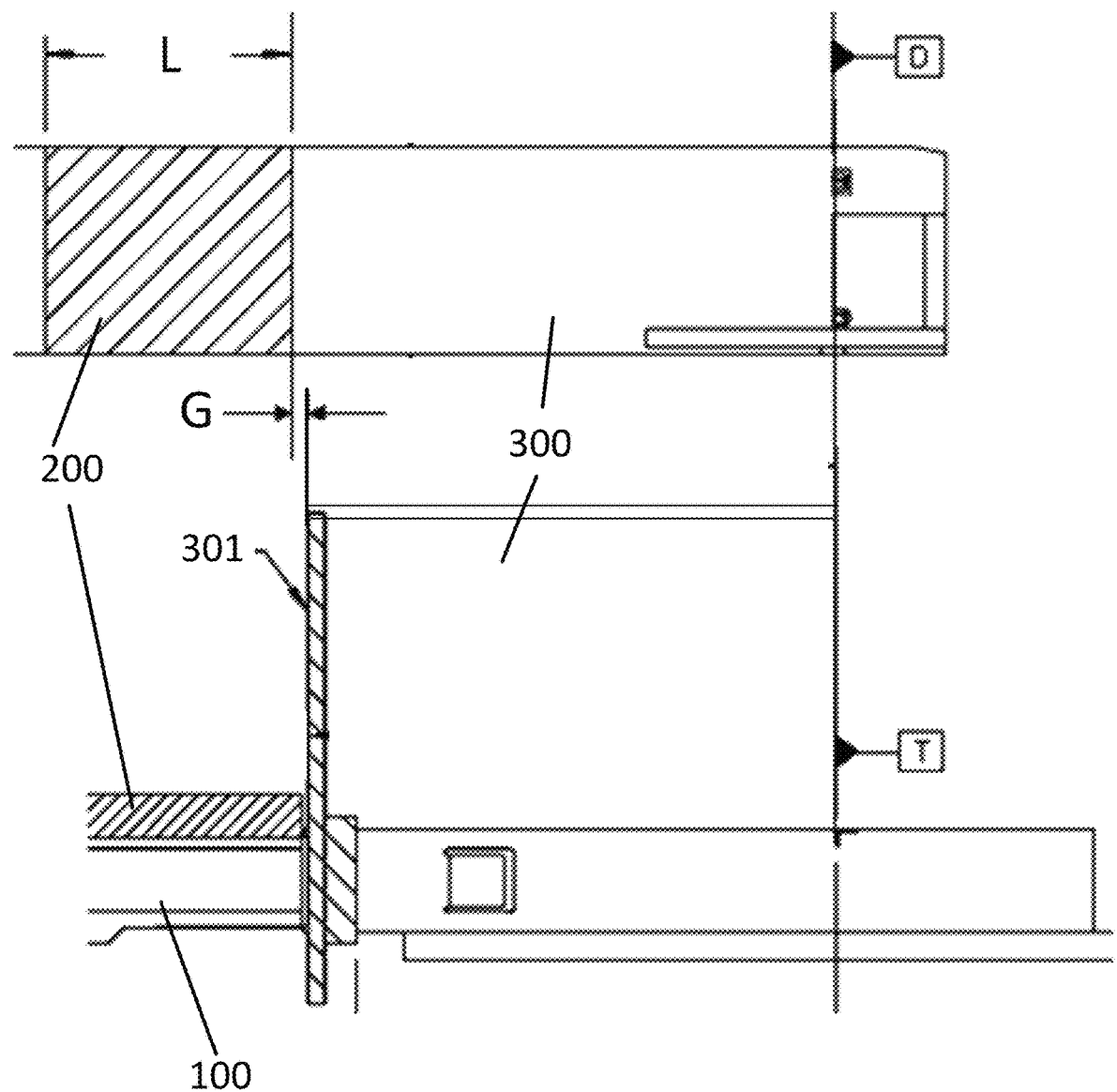
FIG. 2 shows both a top view and a side view of an external heat sink photonic transceiver package structure with lid according to the embodiment of the present invention.

FIG. 2 shows both a top view and a side view of an external heat sink photonic transceiver package structure with lid according to the embodiment of the present invention. Referring to FIG. 1 and FIG. 2, the second position of the external heat sink is a backend position of the cover as well as the multiple fins of the length L. Due to mechanical tolerancing of the face plate 301 of the internally air-cooled thermal sink 300 on its thickness and position relative to system frame, the backend position of the cover of the external heat sink 200 must be limited with a nominal gap G of about 1 (or 2) mm from the customer bezel face plate 301. Because of this gap, pulling air over the multiple fins of the external heat sink 200 is like having a hole in a straw, where the air flow will be greatly reduced to impact thermal dissipation.

In some implementations, referring to FIG. 1, the face plate design of the customer system frame includes an EMI finger 302 disposed in between. In such a configuration, a first photonics transceiver module package 100A is plugged in at a higher position with a first external heat sink 200A facing a face plate 301 and a second photonics transceiver module package 100B is plugged at a lower position with a second external heat sink 200B facing an end face of EMI finger 302. Again, the mechanical tolerance requires a first gap G to be existed between the backend of the first external heat sink 200A and the face plate 301 and a second gap G' between the backend of the second external heat sink 200B and the end face of the EMI finger 302. For both plugged-in packages 200A and 200B of the photonics transceiver modules, the gap G and G' make the air-flow channels less ideal in respective two situations.

Figure 3:
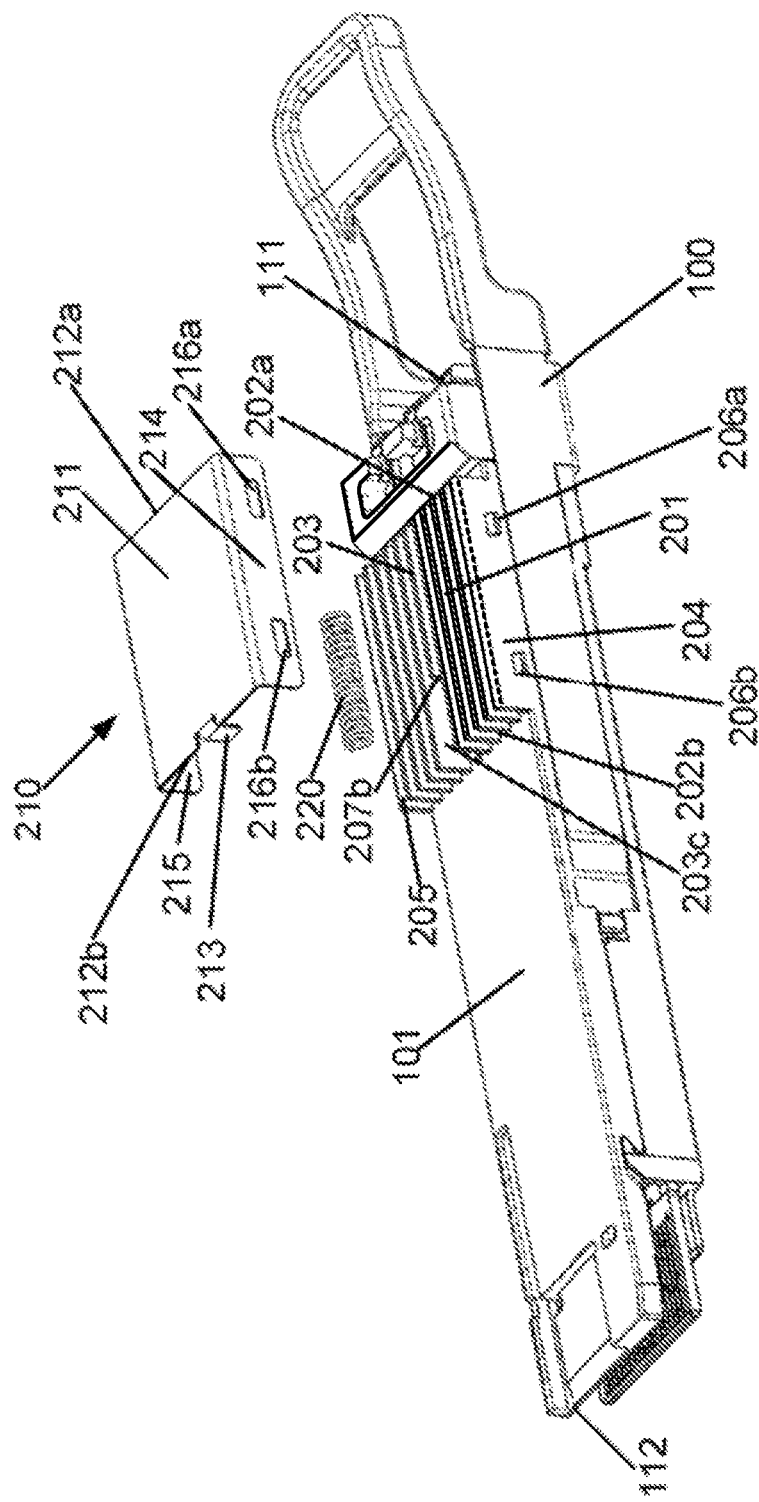
FIG. 3 is a perspective exploded view of an external heat sink formed on a package of a photonic transceiver module according to an embodiment of the present invention.

FIG. 3 is a perspective exploded view of an external heat sink formed on a package of a photonic transceiver module according to an embodiment of the present invention. Referring to FIG. 3, the external heat sink is configured with multiple fins 201 formed vertically on the top-plate member 101 of the package 100 of the photonics transceiver module. In the embodiment, the external heat sink with the multiple fins is formed in region near front end 111 of the package 100. Optionally, a backend region of the package 100 includes electrical connector pins pf the photonics transceiver module for connecting with network system equipment on the other side of the face plate 301 of custom system frame (see FIG. 1). Optionally, the fins are equally separated by a gap distance. All except at least one (203) of the multiple fins 201 have one height above the top-plate member 101 and one length from a first position (front end 202a) to a second position (backend 202b). The at least one fin is shorter in length with its backend 207b in a retracted position relative to the backend 202b of all rest fins 201, forming an elongated void 203c from the backend 202b of all rest fins 201 to the 203b of the at least one fin 203 with a width of two gap distances. Additionally, the multiple fins 201 include two out-most fins with a first fin 204 fixed at a first edge position (fully visible in FIG. 3) and a last fin 205 fixed at a last edge position (partially visible in FIG. 3). Each of these out-most fins is configured with two notches, e.g., 206a and 206b, on the outer face of the first fin 204. The notches on the outer face of the last fin 205 is not directly visible in FIG. 3.

Figure 4A:
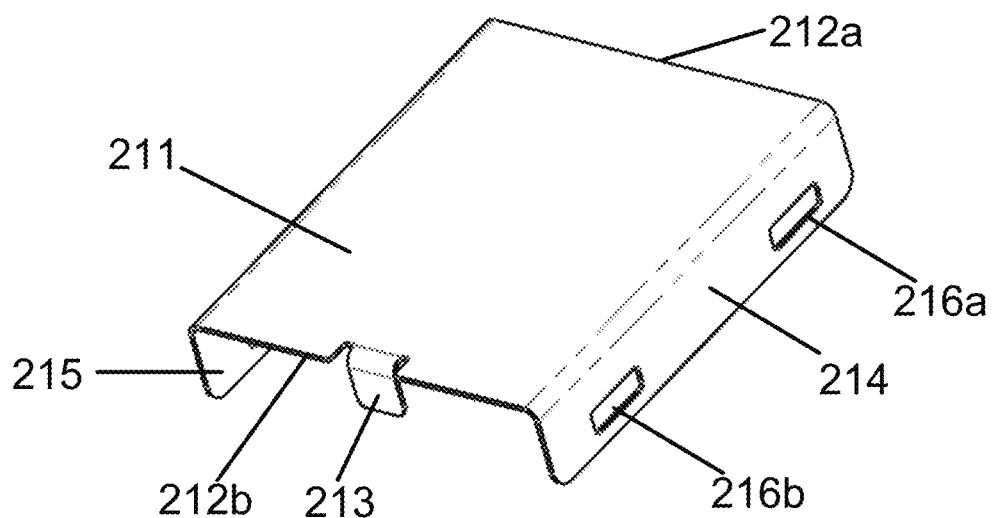
FIG. 4A is a perspective top view of a cover member of the external heat sink of FIG. 3 according to the embodiment of the present invention.
Figure 4B:
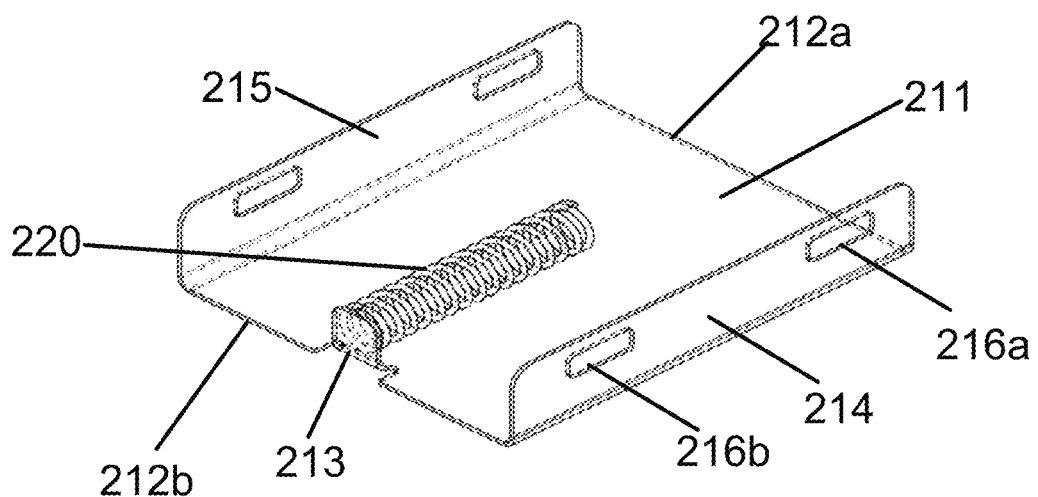
FIG. 4B is a perspective bottom view of the cover member and a loaded spring of the external heat sink of FIG. 3 according to the embodiment of the present invention.

FIG. 4A is a perspective top view of a cover member of the external heat sink of FIG. 3 according to the embodiment of the present invention. FIG. 4B is a perspective bottom view of the cover member and a loaded spring of the external heat sink of FIG. 3 according to the embodiment of the present invention. Referring to FIG. 4A, FIG. 4B, as well as FIG. 3 shown before, the external heat sink includes a cover member 210 configured to cover the entire multiple fins 201 and a spring 220 configured to be loaded under the cover member 210 into the elongated void 203c. The cover member 210 further is characterized by a rectangular shaped horizontal sheet 211 with a front end 212a and a backend 212b along its length direction, two vertical side sheets 214 and 215 connected (along downward direction) to two length edges of the horizontal sheet 211. Each of the two vertical side sheets is configured with two slots e.g., 216a and 216b for side sheet 214, positioned to fit with the two notches, e.g., 206a and 206b, on the corresponding first out-most fin 204 (or the last out-most fin 205) for at least partially lock the cover member 210 substantially entirely over the multiple fins. Each slot 216a or 216b is made with extra free length of a few mini-meters to allow the cover member 210 to be laterally moveable along the length direction while being partially locked with fins (particularly two out-most fins 204 and 205) by the notches in slots. Furthermore, the cover member 210 also includes a vertical flange 213 being set to bent from a middle part of the backend 215 of the cover member 210. Optionally, the vertically flange is positioned corresponding to the elongated void 203c. In the embodiment, the spring 220 is loaded in the elongated void 203c and stopped between the vertical flange 213 and the backend 207b of the at least one fin 203 in shorter length as the cover member 210 is disposed to cover the multiple fins 201. The spring 211 naturally push the cover member 210 backward as it is slide up to the extra free space provided with the two slots (216a and 216b) of each (e.g., 214) of two vertical side sheets respectively with two notches (206a and 206b) being locked therein.

Figure 5:
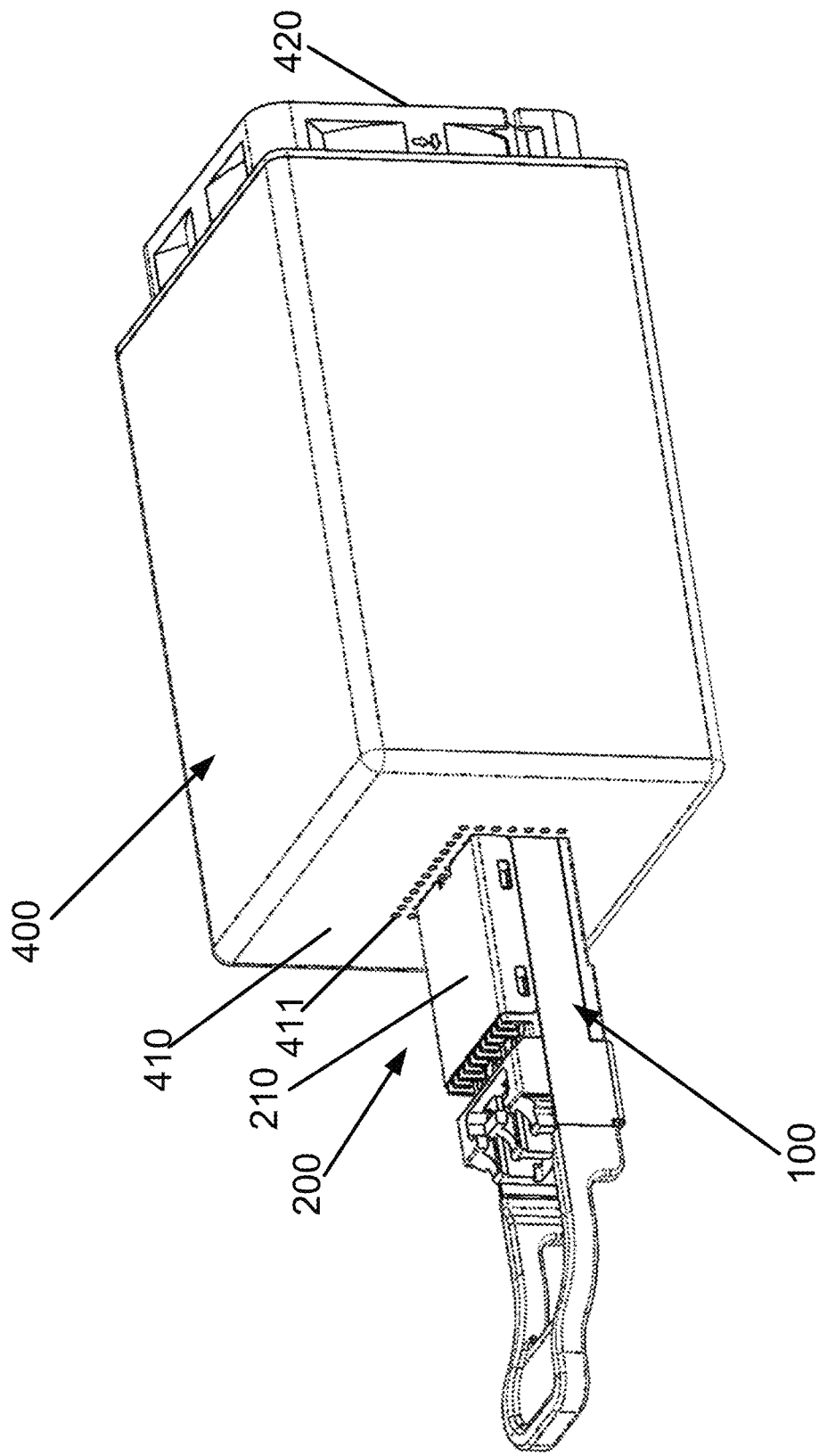
FIG. 5 is a perspective view of a photonic transceiver module having a fixed external heat sink plugged into a custom system having an internal thermal dissipation equipment according to an embodiment of the present invention.

In addition to the exploded view of the package 100 of the photonics transceiver module with a fixed external heat sink 200 (cover member 210, spring 220, and multiple fins 201 fixed to the package 100), FIG. 5 shows a photonic transceiver module having the fixed external heat sink being plugged into an internal thermal dissipation equipment of a custom system frame according to an embodiment of the present invention. Referring to FIG. 5, the internal thermal dissipation equipment 400 is configured with an air-cooled heat sink coupled to an electric-power fan 420 at its backend and a face plate 410 with multiple through-holes at its front end. The fan 420 draws an air flow through air-flow channels formed between gaps between the multiple fins under the cover member to dissipate heat from the front end of the photonics transceiver module into the internal thermal dissipation equipment 400. As the photonics transceiver module is plugged in with its backend being inserted fully inside the internal thermal dissipation equipment 400, the backend of the external heat sink 200 is designed to be left outside but substantially close to the face plate 411 except a nominal gap for room of mechanical tolerance of the internal thermal dissipation equipment 400. Typically, this nominal gap is limited to about 1 millimeter. As described earlier in FIG. 3, FIG. 4A, and FIG. 4B, the cover member (210) is designed to be pushed by the loaded spring 220 to slide along the length direction relative to the fixed fins (201, 204, 203, 205), provided with the extra free distance of the slot (e.g., 216a) relative to the size of the notch (e.g., 206a). When the extra free distance is set to be at least larger than the nominal gap, the backend (211) of the cover member 210 is naturally pushed by the loaded spring 220 to touch the face plate 411, thus closing or at least minimizing the gap. Optionally, the nominal gap is about 1 millimeter and the extra free distance of the slot versus the notch can be set to be 2 or more millimeters.

Figure 6A:
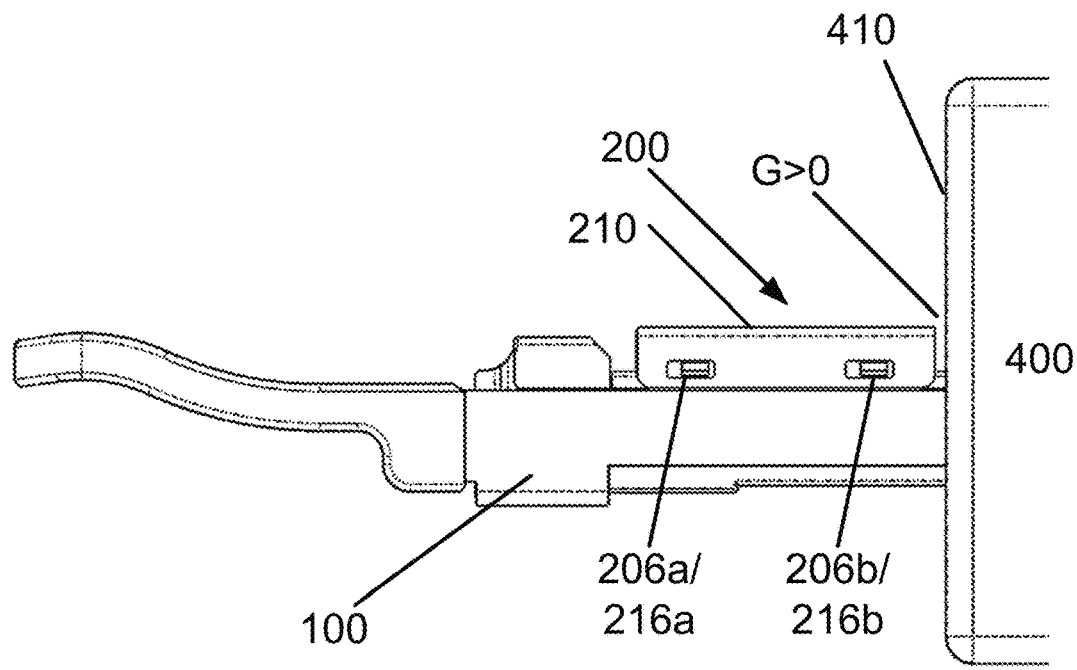
FIG. 6A is a side view of the external heat sink of FIG. 5 with a cover member being at a position separated by an air gap from a face plate of the internal thermal dissipation equipment according to the embodiment of the present invention.

FIG. 6A is a side view of the external heat sink of FIG. 5 with a cover member being at a position separated by an air gap from a face plate of the internal thermal dissipation equipment according to the embodiment of the present invention. Referring to FIG. 6A, this is a plugged-in configuration of the package 100 of photonics transceiver module with a fixed external heat sink 200. This configuration is substantially same as related art where there is an air gap G>0 from the backend of the cover member 210 of the external heat sink 200 to a face plate 410 of the internal thermal dissipation equipment 400. This gap G is intentionally left by design due to manufacture tolerance of the internal thermal dissipation equipment 400. As seen, the cover member 210 is disposed with the two notches 206a and 206b fit in the corresponding two slots 216a and 216b on the outer face of the out-most fin (204). The package 100 is in a plugged-in position in association with the internal thermal dissipation equipment 400. The air gap G>0 causes reduced efficiency in thermal dissipation of the external heat sink 200.

Figure 6B:
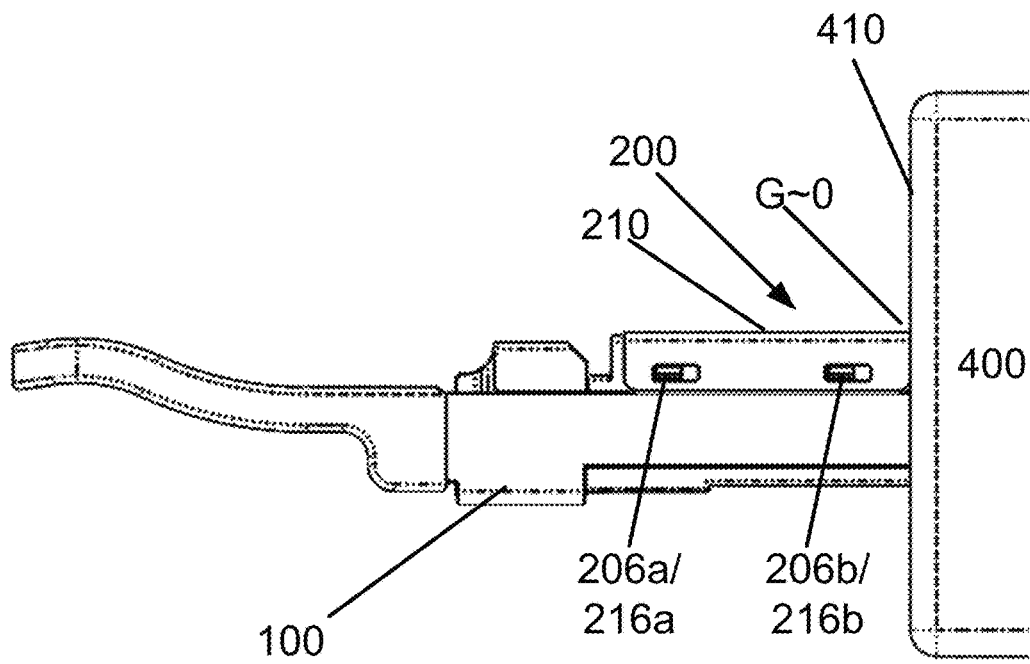
FIG. 6B is a side view of the external heat sink of FIG. 5 with a cover member being at a position with a minimized air gap from the face plate of the internal thermal dissipation equipment according to the embodiment of the present invention.
Figure 6C:
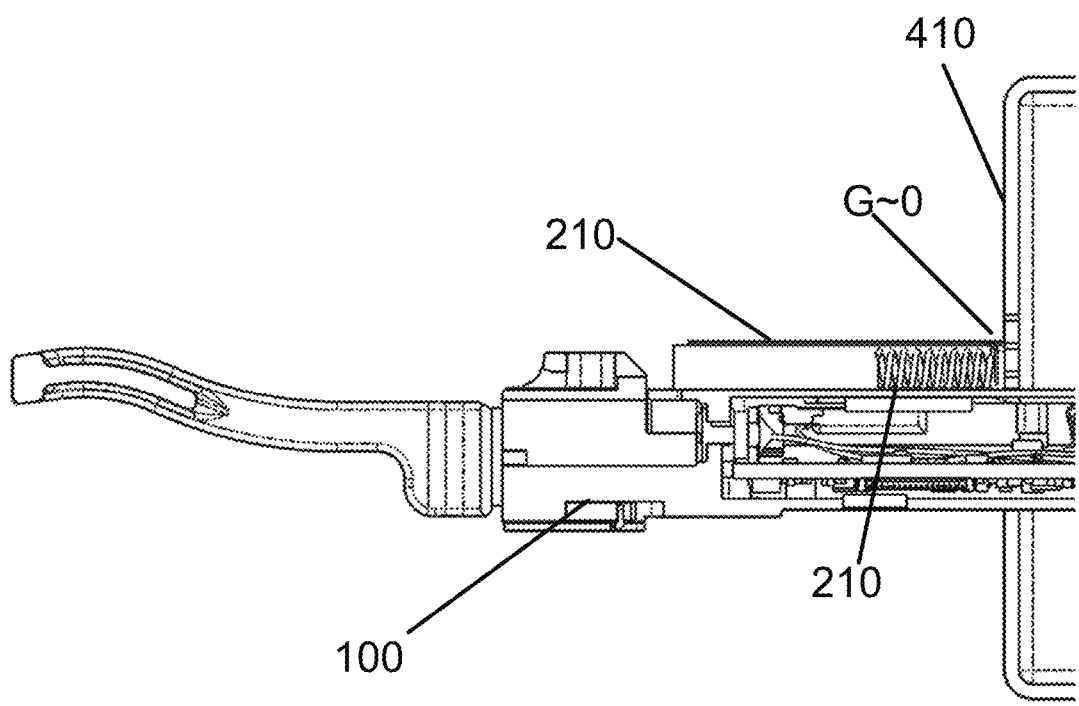
FIG. 6C is a cross-section view of the external heat sink of FIG. 6B with a cover member being pushed by the loaded spring to the position with the minimized air gap from the face plate of the internal thermal dissipation equipment according to the embodiment of the present invention.

FIG. 6B is a side view of the external heat sink of FIG. 5 with a cover member being at a position with minimized air gap from the face plate of the internal thermal dissipation equipment according to the embodiment of the present invention. Referring to FIG. 6B, this is substantially the same plugged-in position associated with the external heat sink 200 versus the face plate 410 of the internal thermal dissipation equipment 400 but with an air gap G~0. The backend (212b) of the cover member 210 slides as indicated to touch the face plate 410, making the air gap G minimized to reduce loss of air flow and improve thermal dissipation efficiency. FIG. 6C shows a cross-section view of the external heat sink of FIG. 6B. This clearly illustrates the function of the loaded spring 210 under the a cover member (stopped between the vertical flange (213) and the backend (207b) of the at least one fin (203) for naturally pushing the backend (212b) of the cover member 210 to be against the face plate 410 to minimize the air gap G (~0).

As shown in FIG. 6B and FIG. 6C in the side views, the horizontal sheet of the cover member (211) is disposed on top ridges of multiple fins and has a same leveled backend with vertical side sheets. The cover member and the multiple fins together form multiple air flow channels in the gaps between neighboring fins to become effective external heat sink for pulling heat of the package through the air flow channels into the internal thermal dissipation equipment. As the backend of the cover member, for both horizontal sheet and two vertical sheets, touches the face plate of the internal thermal dissipation equipment, the nominal gap there left due to mechanical tolerance can be closed or at least minimized. The minimized air gap between the backend of the cover member and the face plate of the internal thermal dissipation equipment substantially enhance heat dissipation efficiency. Optionally, the external heat sink as formed in the embodiment described herein can effectively dissipate heat over 20 W from the front end region of the photonics transceiver module.

In another aspect, the present disclosure provides a package for a compact photonics transceiver module. The package includes an external heat sink described herein to pull air flow therefrom for dissipating heat up to 20 W out of the front region of the photonics transceiver module. The package is a compact and pluggable type configured to in Quad Small Form-Factor Pluggable (QSFP) specification. Alternatively, the package is a compact and pluggable type configured to in Quad Small Form-Factor Pluggable Double Density (QSFP-DD) specification. Optionally, the package is a compact and pluggable type configured to in Quad Small Form-Factor Pluggable Double Density Type II (QSFP-DD type 2) specification.

Figure 7:
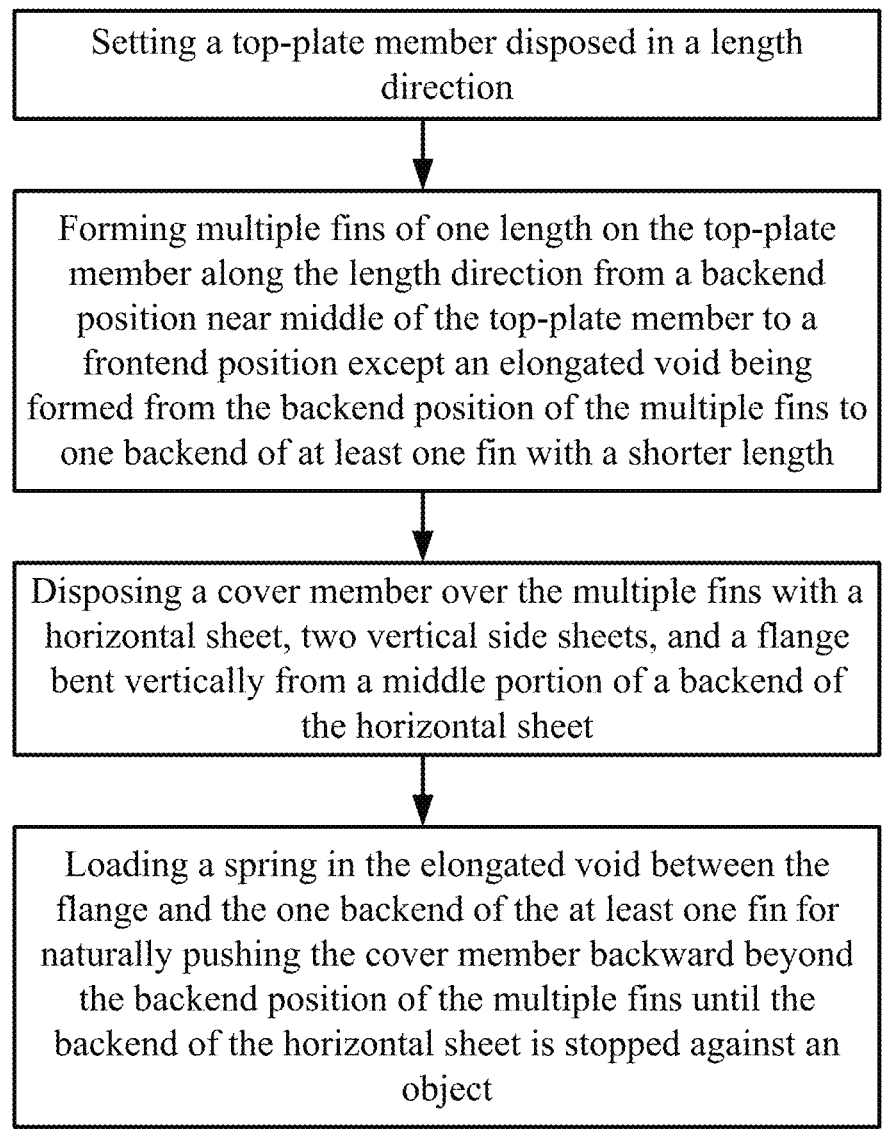
FIG. 7 is a flow chart illustrating a method of thermal dissipation for a package of a photonic transceiver module according to an embodiment of the present invention.

In yet another aspect, the present disclosure provides a method of dissipating heat out of a package of a photonic transceiver module, especially for high-power photonics transceiver module in compact form factor for high-speed data communication. FIG. 7 shows a flow chart illustrating a method of thermal dissipation for a package of a photonic transceiver module according to an embodiment of the present invention. Referring to FIG. 7 and further referring to FIG. 3, FIG. 6B and FIG. 6C, the method is implemented through an apparatus described herein for dissipating heat up to 20 W out of front region of the package of photonics transceiver module. In the embodiment, the method includes a step of setting a top-plate member disposed in a length direction. Particularly, the method employs an apparatus for dissipating heat out of the package (such as one in QSFP-DD specification) of the photonics transceiver module.

Additionally, the method includes a step of forming multiple fins of one length on the top-plate member along the length direction from a backend position near middle of the top-plate member to a frontend position except an elongated void being formed from the backend position of the multiple fins to one backend of at least one fin with a shorter length. The multiple fins fixed vertically on the top-plate member to become parts of an external heat sink located near front end region of the package. Optionally, all fins including the at least one fin with the shorter length has a same height and equal separation (gap) from its neighboring fins. Optionally, all fins including the at least one fin with the shorter length have a leveled front end at a first position on the top-plate member near the front end of the package. Optionally, all fins except the at least one fin with the shorter length have a leveled backend at a second position near middle region of the package. Optionally, each of the two out-most fins (the first fin and the last fin) has two notches formed on its outer face separated with a spacing in the length direction.

Furthermore, the method includes a step of disposing a cover member over the multiple fins with a horizontal sheet, two vertical side sheets, and a flange bent vertically from a middle portion of a backend of the horizontal sheet. In the embodiment the cover member described here is another part of the external heat sink. Optionally, the horizontal sheet of the cover member is a rectangular shape having a length at least longer than the length of the fins. Optionally, the two vertical side sheets are bent from two opposed side edges of the horizontal sheet and have a same length as that of the horizontal sheet and a same (or larger) height as (than) the height of the fins. Each of the two vertical side sheets is configured to have two slots formed in respective position for the two notches on the outer face of the out-most fin to fit in while with extra free spacing in the length direction. Optionally, the flange is substantially aligned with the elongated void to face the backend of the at least one fin with the shorter length. As the cover member is disposed in position, the horizontal sheet is in touch with top ridges of all fins and the slots on the two vertical side sheets take the notches to partially lock the cover member with the fins. Optionally, the flange is substantially aligned with the elongated void to face the backend of the at least one fin with the shorter length as the cover member is disposed in the position described above.

Moreover, the method including loading a spring into the elongated void while disposing the cover member into the position over the multiple fins and having the notches partially being locked by the slots. The loaded spring is stopped between the flange and the backend of the at least one fin with the shorter length. Naturally, the loaded spring pushes the cover member to be movable laterally along the length direction allowed by the extra free spacing set for the slots. The backend of the cover member is able to slide backward. Provided that the extra free spacing is larger than a designed nominal gap of about 1 mm to a system frame in which the package of the photonics transceiver module is plugged, the backend of the cover member is naturally in touch with a face plate of the system frame (in some embodiments, it is an internal thermal dissipation equipment associated with a custom network system). In other words, the step of the method naturally close or at least minimize an air gap caused by the designed nominal gap that results in leak of air flow in the multiple air flow channels of the external heat sink. As the result, the heat dissipation efficiency of the external heat sink is substantially enhanced. Optionally, the method is have the external heat sink described above to effectively dissipate heat up to 20 W away from the front end region of the photonics transceiver module.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An apparatus for dissipating heat, from a photonic module, the apparatus comprising:
   a top-plate member disposed in a length direction of a package for the photonic module;
   a plurality of fins with one length formed on the top-plate member along the length direction of the package for the photonic module from a backend position of the plurality of fins near a middle of the top-plate member to a frontend position, an elongated void being formed from the backend position of the plurality of fins to a backend of at least one fin of the plurality of fins with a shorter length;
   a cover member disposed over the plurality of tins with a horizontal sheet, two vertical side sheets, and a flange bent vertically from a middle portion of a backend of the horizontal sheet; and
   a spring loaded in the elongated void between the flange and the one-backend of the at least one fin of the plurality of fins for pushing the cover member to slide backward beyond the backend position of the plurality of fins until the backend of the horizontal sheet is stopped against an internal thermal dissipation equipment.

2. The apparatus of claim 1 wherein the plurality of fins, the cover member, and the spring define an external heat sink that, is coupled to a face plate of the internal thermal dissipation equipment.

3. The apparatus of claim 2 wherein the plurality of fins is configured vertically on the top-plate member with a same height and a gap between any two neighboring ones of the plurality of fins throughout the one length of the plurality of fins with the backend position of the plurality of fins being separated by a gap distance of about 1 to 2 millimeters from the face plate of the internal thermal dissipation equipment as the photonic module is plugged in.

4. The apparatus of claim 3 wherein the plurality of fins comprises two outermost fins, each of the two outermost fins having two notches formed at an outer face thereof.

5. The apparatus of claim 4 wherein each of the two vertical side sheets of the cover member comprises two slots respectively for fitting the two notches so that the cover member is partially locked with the plurality of fins, each of the two slots having extra free spacing relative to the two notches larger than the gap distance in the length direction of the package for the photonic module.

6. The apparatus of claim 5 wherein the extra free spacing is configured to be larger than the gap distance for the cover member to move laterally along the length direction of the package for the photonic module as the spring pushes the backend of the horizontal sheet against the face plate of the internal thermal dissipation equipment.

7. The apparatus of claim 5 wherein the horizontal sheet, of the cover member is disposed to touch top ridges of the plurality of fins to form a plurality of air flow channels in gaps between two neighboring ones of the plurality of fins for pulling heat of the package for the photonic module into the internal thermal dissipation equipment to minimize an air gap between the backend of the horizontal sheet and the face plate of the internal thermal dissipation equipment.

8. The apparatus of claim 1 wherein the package for the photonic module comprises an optical transceiver module in Quad Small Form-Factor Pluggable (QSFP) specification.

9. The apparatus of claim 1 wherein the package for the photonic module comprises an optical transceiver module in Quad Small Form-Factor Pluggable Double Density (QSFP-DD) specification.

10. The apparatus of claim 1 wherein the package for the photonic module comprises an optical transceiver module in Quad Small Form-Factor Pluggable Double Density Type II (QSFP-DD type 2) specification.

11. A package structure comprising the apparatus of claim 1 for dissipating heat up to 20 W therefrom.

12. The package structure of claim 11 wherein the photonic module is configured to be an optical transceiver module in Quad Small Form-Factor Pluggable Double Density Type 11 (QSFP-DD type 2) specification.

13. A method of dissipating heat from a package for a photonic module, the method comprising:

setting a top-plate member disposed in a length direction of the package for photonic module;

forming a plurality of fins of one length on the top-plate member along the length direction of the package for the photonic module from a backend position of the plurality of fins near a middle of the top-plate member to a frontend position, an elongated void being formed from the backend position of the plurality of fins to a backend of at least one fin of the plurality of fins with a shorter length;

disposing a cover over the plurality of fins with a horizontal sheet, two vertical side sheets, and a flange bent vertically from a middle portion of a backend of the horizontal sheet; and loading a spring in the elongated void between the flange and the backend of the at least, one fin of the plurality of fins for pushing the cover member backward beyond the backend position of the plurality of fins until the backend of the horizontal sheet is stopped against an internal thermal dissipation equipment.

14. The method of claim 13 wherein providing the plurality of fins, the cover member, and the spring forms an external heat sink coupled to a face plate of the internal thermal dissipation equipment for the photonic module.

15. The method of claim 14 wherein forming the plurality of fins comprises configuring each fin vertically with a height on the top-plate member and laterally with a gap between any two neighboring fins throughout the one length of the plurality of fins with the backend position of the plurality of fins being separated by a gap distance of about 1 to 2 millimeters from the face plate of the internal thermal dissipation equipment as the photonic module is plugged in.

16. The method of claim 15 wherein forming the plurality of fins comprises forming two notches at each outer surface of two of the plurality of tins located at two outermost locations among the plurality of fins.

17. The method of claim 16 wherein disposing the cover member comprises having two slots formed at the two vertical side sheets to fit with the two notches for partially locking the cover member with the plurality of fins, each of the two slots having extra free spacing relative to the two notches larger than the gap distance in the length direction of the package for the photonic module.

18. The method of claim 17 wherein the extra free spacing is configured to be larger than the gap distance for the cover member to be moveable laterally along the length direction of the package as the spring pushes the backend of the horizontal sheet against the face plate of the internal thermal dissipation equipment.

19. The method of claim 15 wherein disposing the cover member further comprises forming a plurality of air flow channels for pulling heat of the package through the plurality of fins into the internal thermal dissipation equipment to minimize an air gap between the backend of the horizontal sheet and the face plate of the internal thermal dissipation equipment.

20. The method of claim 19 wherein forming the plurality of air flow channels to minimize the air gap between the backend of the horizontal sheet and the face plate of the internal thermal dissipation equipment further comprises providing thermal dissipation up to 20 W in heat power.

* * * * *